(12) United States Patent
Yokoyama

(10) Patent No.: US 7,456,562 B2
(45) Date of Patent: Nov. 25, 2008

(54) FIELD EMISSION ORGANIC LIGHT EMITTING DIODE

(76) Inventor: Meiso Yokoyama, 2-19-60-301, Mihara, Asaka-shi, Saitama-Ken (JP) 351-0025

( * ) Notice: Subject to any disclaimer, the term of this patent is extended or adjusted under 35 U.S.C. 154(b) by 485 days.

(21) Appl. No.: 11/308,538

(22) Filed: Apr. 4, 2006

(65) Prior Publication Data

US 2007/0164663 A1    Jul. 19, 2007

(30) Foreign Application Priority Data

Jan. 17, 2006    (TW) .............................. 95101663 A

(51) Int. Cl.
*H01J 1/62* (2006.01)
*H01J 63/04* (2006.01)

(52) U.S. Cl. .................. 313/495; 313/496; 313/497; 313/498; 313/503; 313/504; 313/505; 313/506

(58) Field of Classification Search ......... 313/495–498, 313/503–506
See application file for complete search history.

(56) References Cited

U.S. PATENT DOCUMENTS

| | | | | |
|---|---|---|---|---|
| 7,304,440 | B2 * | 12/2007 | Ohwada et al. | 315/291 |
| 7,379,037 | B2 * | 5/2008 | Takeuchi et al. | 345/75.2 |
| 2005/0104499 | A1 * | 5/2005 | Kymissis et al. | 313/311 |
| 2005/0162066 | A1 * | 7/2005 | Park | 313/495 |
| 2005/0162067 | A1 * | 7/2005 | Shiraga et al. | 313/495 |
| 2005/0264168 | A1 * | 12/2005 | Lee | 313/496 |
| 2006/0170329 | A1 * | 8/2006 | Tojo et al. | 313/495 |
| 2006/0214557 | A1 * | 9/2006 | Ohwada et al. | 313/495 |

* cited by examiner

*Primary Examiner*—Nimeshkumar D. Patel
*Assistant Examiner*—Thomas A Hollweg
(74) *Attorney, Agent, or Firm*—Pai Patent & Trademark Law Firm; Chao-Chang David Pai

(57) ABSTRACT

The essential thought of this patent is that organic emission layer is utilized instead of inorganic phosphor thin film in field emission display (FED). The field emission organic light emitting diode (FEOLED) in this invention is configured with an electron multiplier (dynode) between the cathode of FED and the organic emission layer, wherein secondary electron material is coated in the holes of the dynode. The design for the organic emission layer, which includes a hole injection layer (HIL), a hole transport layer (HTL) and an emission layer (EL), is able to attain higher luminance and lower power consumption for the innovative FEOLED than conventional OLED.

18 Claims, 15 Drawing Sheets

(A)

(B)

(2)

(1)

(1)

(2)

(1)

(2)

FIELD EMISSION ORGANIC LIGHT EMITTING DIODE

BACKGROUND OF THE INVENTION

1. Field of the Invention

This invention relates to an improved design of field emission display (FED) and more particularly to an FED in which the inorganic fluorescent screen is replaced by an organic EL light emitting layer, forming an innovative field emission organic light emitting diode (FEOLED) with improved luminance and lower power consumption.

2. Description of the Related Art

The CRT (cathode-ray tube) is widely employed in TVs and computer terminals. There are three main parts of a CRT: (1) a cathode electrode for hot electron source, (2) a deflection system for deflecting hot electrons injecting from the cathode electrode in perpendicular and horizontal directions to the inorganic phosphor on a fluorescent screen, and (3) an indium tin oxide (ITO) anode electrode on a transparent glass substrate, which ITO anode electrode is coated with inorganic fluorescent screen. Hot electrons generated by applying a high voltage between the cathode and the ITO anode electrode impact the inorganic phosphor on a fluorescent screen to give rise to light. Such device is called a CRT or a Braun tube.

Conventionally, the flat panel display such as FED or SED (surface emission display) is similar to the traditional CRT. Its basic principle of operations is similar to that of CRT. Basically, the emitted electrons bombard the inorganic phosphor of a fluorescent screen, to cause the light emission. However, FED and SED differ from CRT in two main aspects: (1) electrons are emitted from cold cathode electrode; and (2) it is not necessary to have a deflection system for deflecting hot electrons in perpendicular and horizontal directions to the inorganic phosphor. However, the inorganic fluorescent screen for the anode electrode is the same as for CRT display.

Another prior art flat panel display is the OLED (organic light emitting diode) display. The typical structure of OLED comprises (1) an anode electrode of indium tin oxides (ITO) coated on glass substrate, (2) cathode electrode made of low work function metal, and organic multiple layers between the anode and the cathode. Generally, the organic films are deposited by evaporation in a vacuum chamber. When D.C. voltage is applied between the transparent ITO electrode (anode electrode) and the cathode electrode, holes from the anode electrode flow into the hole transport layer (HTL), electrons from the cathode electrode flow into the electron transport layer (ETL). Both carriers (holes and electrons) move toward the interface between the two transport layers (HTL and ETL) and recombine to form excitons. Then these excitons emit light through the transparent electrode (ITO coated on glass substrate). Therefore, the light emitting process for OLED is completed in solid state phase.

For FED and SED, when electric voltage is applied, neither the injection and transport of carriers nor light emission is completed in solid state phase. The light emitting principle of FED and SED is that the electrons are excited and accelerated by the high electric field under vacuum so as to become sufficiently energized to bombard the inorganic phosphor to emit light. Such process is called CL (cathode luminescence).

The inventor has previously applied for patent in an electron multiplier (Dynode) for FED innovation, described in Japan Pat. Pub. No. 2004-227801. The invention discloses a design in which FED luminosity was enhanced by adding secondary electron material-coated holes to the dynode.

Moreover, the inventor has also previously applied for patent in a white light organic electroluminescence (EL) innovation, described in Japan Pat. Pub. No. 2005-150078. The essence of that innovation was that a highly purified white light organic EL can be constructed by stacking three organic emitting layers of different colors (red, green and blue) to an ITO coated glass substrate.

SUMMARY OF INVENTION

Although the inventor was very successful in achieving the result in different light colors for OLED research, the luminous efficiency was only 7cd/A. Thus, it does not yet meet the requirement for high efficiency flat panel display.

On the other hand, the inventor made a first-ever discovery of the organic electroluminescence principle. That is, the FEOLED luminescent mechanism is different from that of the traditional FED. In traditional FED, the inorganic phosphor illuminates as a result of electron beam bombardment. Whereas in FEOLED, the replacement of the inorganic phosphor by the organic EL light emitting layer results in a luminescent mechanism similar to that of the recombination mechanism found in OLED, only with higher luminescent efficiency.

This invention effectively integrates the luminescent characteristics of FED and OLED, yielding an FEOLED that is more efficient than the traditional OLED.

BRIEF DESCRIPTION OF THE DRAWINGS

The objects and advantages of the present invention will be better understood from the following detailed description, with reference to the accompanying drawings in which.

DETAILED DESCRIPTION OF THE PREFERRED EMBODIMENTS

Figure 1:
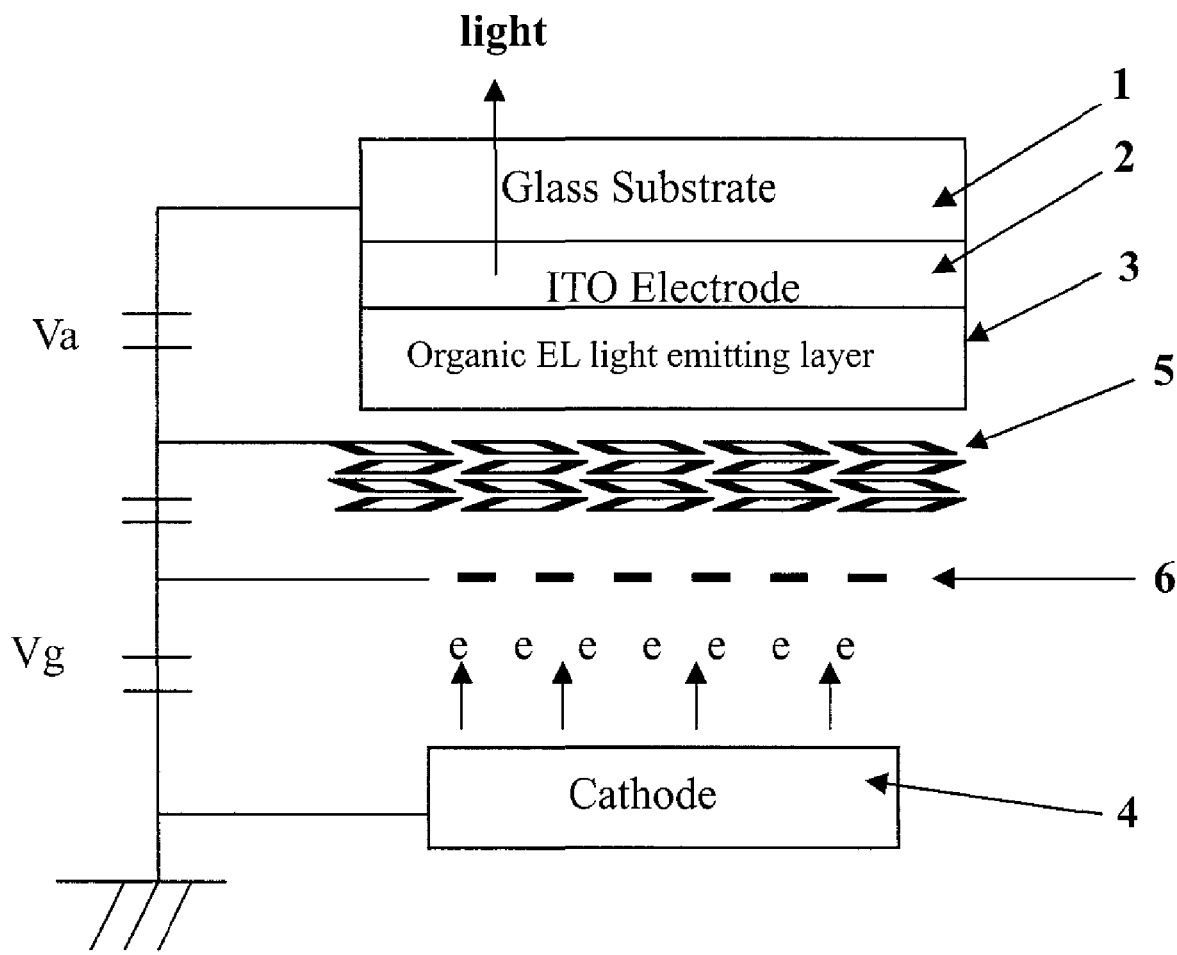
FIG. 1 is a cross-sectional schematic view of a first embodiment of the FEOLED device of the present invention.

A field emission organic light emitting diode (FEOLED) is depicted in FIG. 1. It comprises a transparent glass substrate 1, an indium tin oxide (ITO) anode electrode 2, an organic electroluminescence (EL) light emitting layer 3, a cathode 4, a dynode 5 and a grid electrode 6. The organic EL light emitting layer 3 is disposed between the ITO anode electrode 2 and the cathode 4 and replaces the inorganic fluorescent screen of a field emission display (FED).

As depicted in FIG. 1, the dynode 5 is formed between the cathode 4 and the organic EL light emitting layers 3. Here, primary electrons emitting from the cathode 4 collide with the secondary electron material in the dynode 5 as they pass through the dynode holes. The collision increases the number of the electrons reaching the organic EL light emitting layer 3, thus enhancing the luminous efficiency of the organic EL light emitting layer 3.

Additionally, the organic EL light emitting layer 3 can also be coated with secondary electron material.

Figure 2:
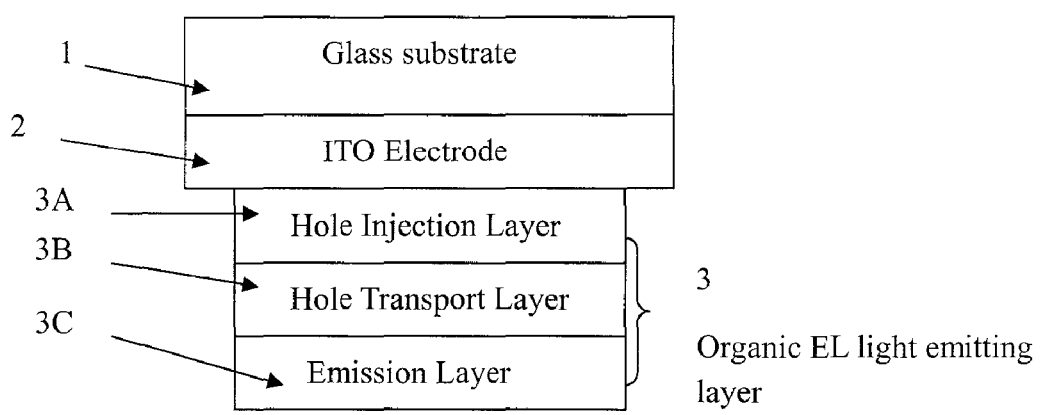
FIG. 2 is a cross-sectional schematic view of the organic EL light emitting layers on the ITO anode of the first embodiment of the FEOLED device of the invention.

FIG. 2 depicts the multi-layer structure of the organic EL light emitting layer 3. Starting from the interface with the ITO anode electrode, there is the hole injection layer 3A, which is followed by the hole transport layer 3B, then the emission layer 3C, and finally the secondary electron material coating on the emission layer 3C.

Figure 9:
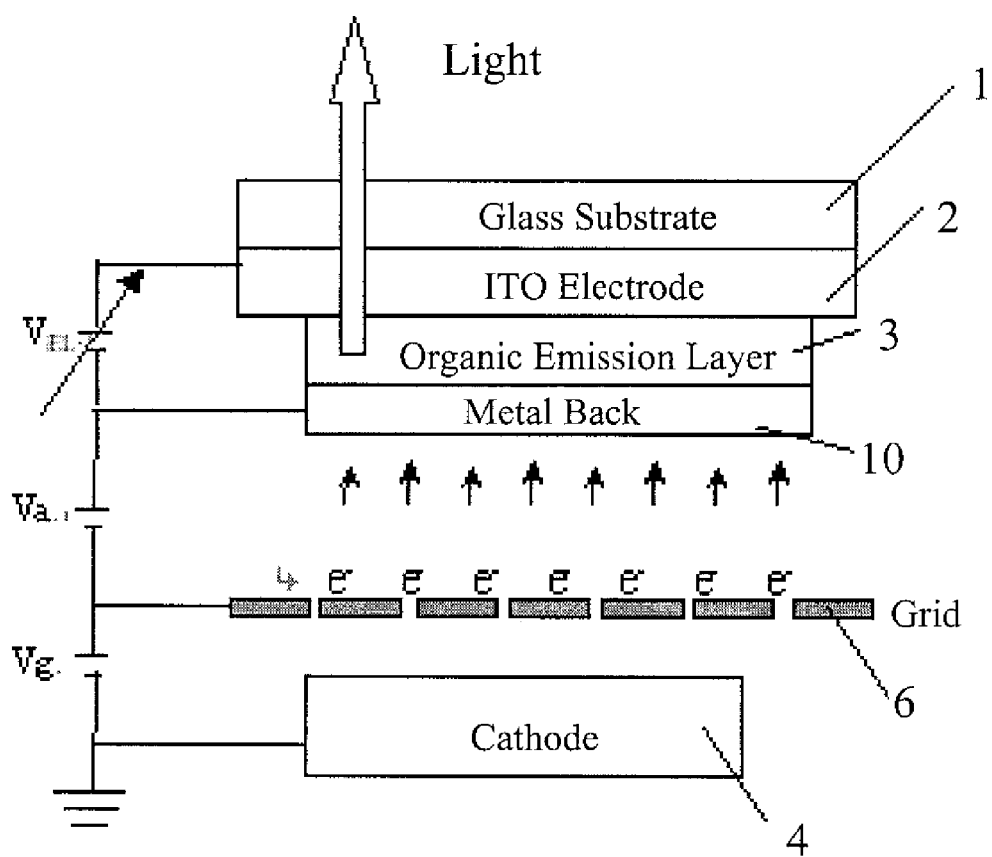
FIG. 9 is a cross-sectional schematic view of a fourth embodiment of the FEOLED device of the present invention.
Figure 10:
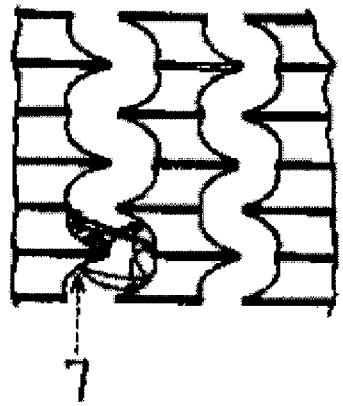
FIG. 10 is a cross-sectional schematic view of an electron multiplier (the box type dynode) disclosed in Japan Pat. Pub. No. 2004-227801: (1) the aperture of dynode with a flat inclined plane, (2) the stack of dynode.
Figure 10:
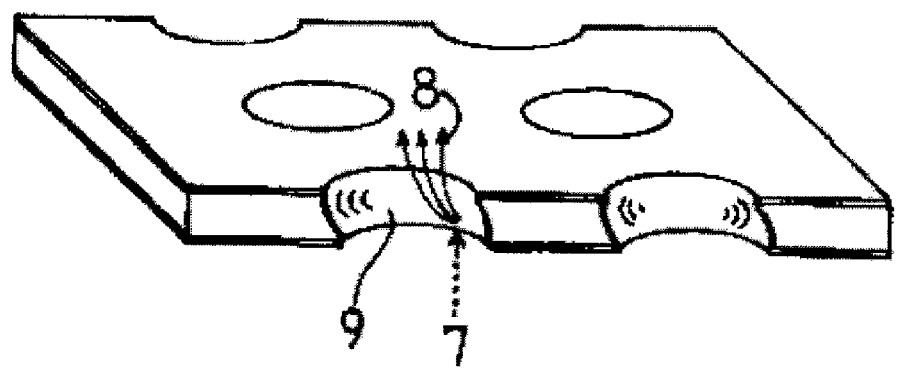
Figure 11:
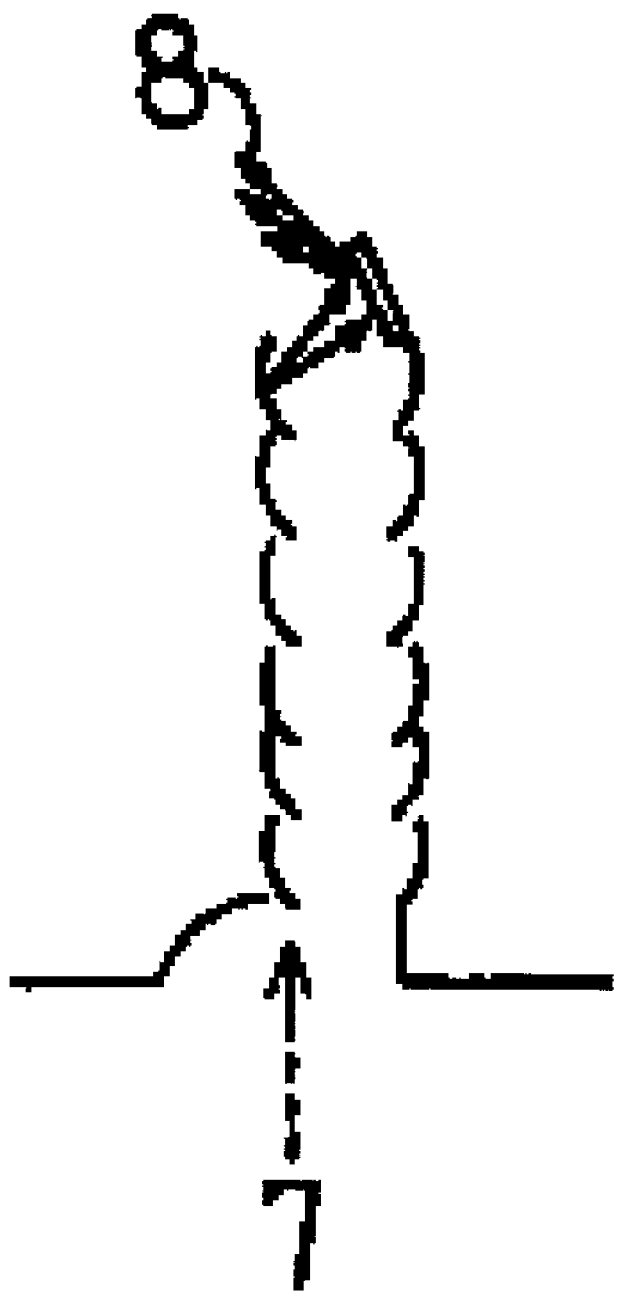
FIG. 11 is a schematic view of the line focus type dynode also disclosed in Japan Patent Pub. No. 2004-227801.
Figure 12:
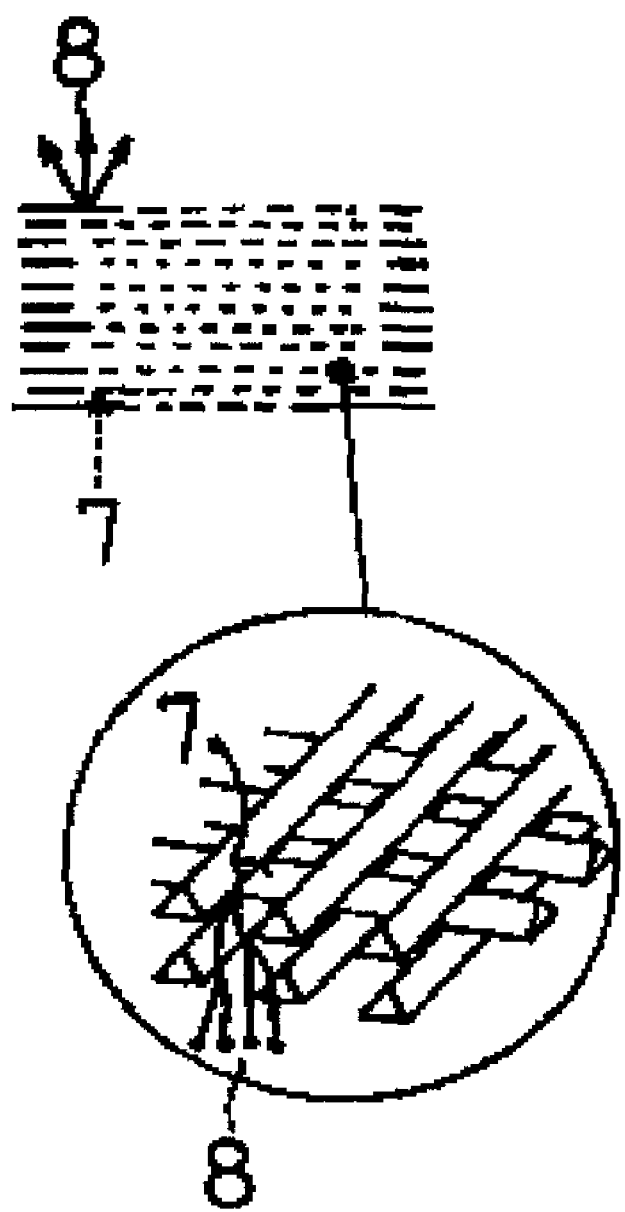
FIG. 12 is a schematic view of the mesh type dynode also disclosed in Japan Pat. Pub. No. 2004-227801.
Figure 13:
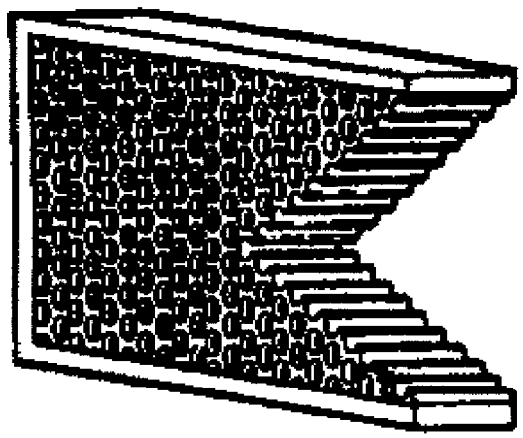
FIG. 13 is a schematic view of the MPC type dynode also disclosed in Japan Pat. Pub. No. 2004-227801: (1) a partial cutout inclined view of the dynode, (2) cross-sectional view of the dynode.
Figure 13:
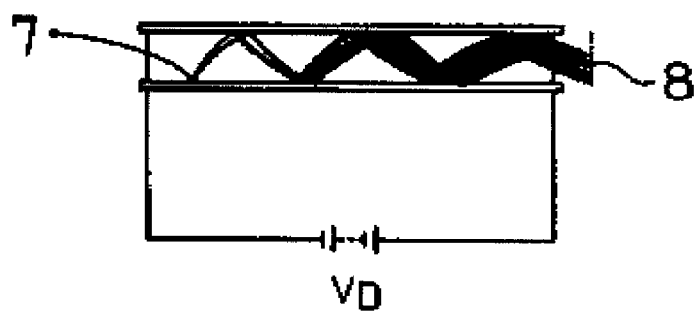

FIG. 9 shows the FEOLED device of the fourth embodiment of the present invention. The multi-layer structure of the organic EL light emitting layer 3 has the same structure as that of FIG. 2 except for the metal back 10. The metal back 10 is attached to the secondary electron material coating on the emission layer 3C for adjusting EL intensity. The light color of the organic EL light emitting layer 3 described above can be changed by changing its material and structure.

As the electron source, the cathode 4 can be made of low work function metal such as tungsten, or implemented with a cold electron source cathode of the CNT, Spindt, PN, MIM, or surface emission types.

Refer to FIG. 1, the dynode 5 can be of the metal channel, box, line focus, mesh, or MPC types as shown in FIGS. 10-14.

The secondary electron material in the dynode 5 can be Cu—Be or Ag—Mg alloys. The secondary electron material coating on the organic EL light emitting layer 3 can be metal oxide of Be, Mg, or Ca.

This invention replaces the inorganic phosphor thin film used in FEDs with the organic EL light emitting layer 3. Electrons emitted from the cathode 4 enter the organic EL light emitting layer 3, causing carrier recombination and giving rise to light. The luminescent mechanism is similar to that of the conventional OLED. The luminosity can be controlled by adjusting the amount of electrons emitting from the cathode 4.

Refer to FIG. 1, the installation of the dynode 5 increases the quantities of electrons entering the organic EL light emitting layer 3, thus enhancing the luminous efficiency of the organic EL light emitting layer 3.

Refer to FIG. 2, the stacking of the hole injection layer 3A, hole transport layer 3B, emission layer 3C, and secondary electron material coating increases the anode current, which in turn prevents the luminous efficiency from becoming saturated when anode voltage increases.

Refer to FIG. 9, the configuration of organic EL light emitting layer 3 is, starting from the interface with the ITO anode electrode 2, the hole injection layer 3A, hole transport layer 3B, emission layer 3C, secondary electron material, and metal back 10. The voltage $V_{EL}$ applied between the ITO anode electrode 2 and the metal back 10 can be adjusted. Therefore, only a small amount of electrons is needed to cause the organic EL light emitting layer 3 to give rise to light.

Moreover, light color of the organic EL light emitting layer 3 can be changed by changing its material and structure.

Depending on the existence of the metal back 10, the luminosity can also be changed.

As an electron source, the cathode 4 can be a cold electron source cathode of the CNT type, which has the advantage of low voltage usage, good durability, and low cost. Of course, the cathode 4 can be implemented with other types of cold cathode.

Refer to FIG. 1, the dynode 5 can be implemented with a dynode of the metal channel type to achieve long period of luminescence. Other types of dynode can also be used.

The electron-generating material of the dynode 5, which increases the amount of secondary electrons, can be made of Cu—Be alloy or Ag—Mg alloy.

When applying a voltage to this sequential stacking of glass substrate 1, ITO anode electrode and an organic EL light emitting layer 3 coated with secondary electron material and attached with a metal back protection layer, an innovative organic EL component is obtained.

The invention, which replaces the inorganic fluorescent screen in an FED with an organic EL light emitting layer and effectively uses the organic EL's luminescent characteristics, results in an FEOLED that generates much higher luminosity than the conventional OLED.

It should be noted that in order to achieve the design goal, the organic EL light emitting layer 3 must be formed of the hole injection layer 3A, hole transport layer 3B, and the emission layer 3C.

Figure 14:
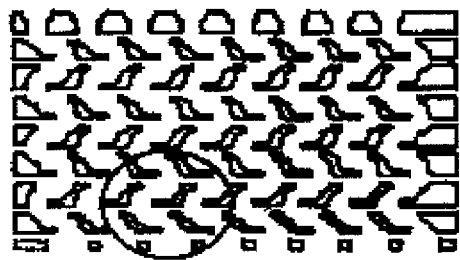
FIG. 14 is a schematic view of the metal channel type dynode also disclosed in Japan Pat. Pub. 2004-227801: (1) cross-sectional view of the dynode, (2) enlarged cross-sectional view of the dynode.
Figure 14:
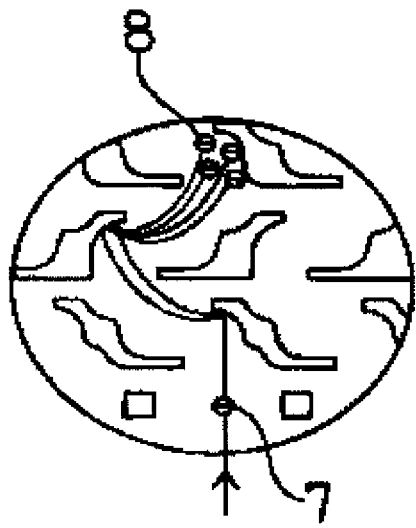

The implementation of this invention is described in detail below. The most preferred dynode 5 should be of the metal channel type as shown in FIG. 14. The most preferred secondary electron material coated in the dynode is Cu—Be alloy or Ag—Mg alloy. Other types of dynodes, for example, the box type shown in FIG. 10, the line focus type in FIG. 11, the mesh type in FIG. 12, and the MPC type in FIG. 13, can all be installed between the cathode 4 and the ITO anode electrode 2 of this FEOLED invention. The secondary electron material can be coated on the dynode 5 as well as on the metal back 10 of the organic EL light emitting layer 3.

Figure 8:
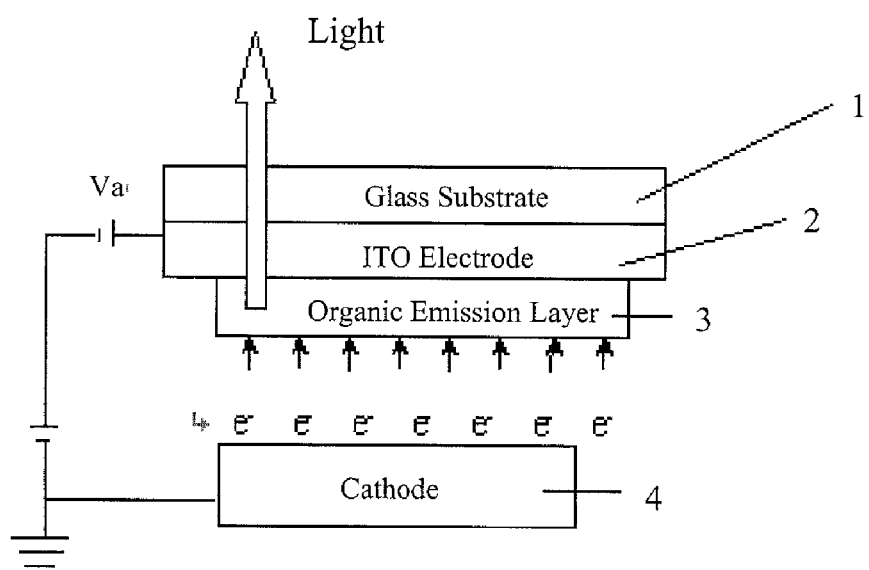
FIG. 8 is a cross-sectional schematic view of a third embodiment of the FEOLED device of the present invention.

FIG. 8 shows the FEOLED device of the third embodiment of the present invention in which the dynode is omitted. In such case, the secondary electron material, which can be made of oxides of Be, Mg, or Ca, is coated directly on the organic EL light emitting layer 3.

Refer to FIG. 9, in designs in which the dynode 5 is absent, a metal back 10 can be grown on the organic EL light emitting layer 3. This metal back 10 interfaces the organic EL light emitting layer 3 to the cathode 4, as well as prevents damages caused when electrons are injected to the organic EL light emitting layer 3. The metal back 10 can be made of Cu—Be, Ag—Mg, or Au—Ca alloys. In such configuration, a bias voltage $V_{EL} < V_{th}$ ($V_{th}$=threshold voltage for electroluminescence) is first applied between the ITO anode electrode 2 and the metal back 10. Subsequently, the aforementioned secondary electron materials, such as oxides of Be, Mg, or Ca, can be grown between the organic EL light emitting layer 3 and the metal back 10. The combined thickness of the secondary electron material and the metal back 10 is around 12 nm.

In the configuration depicted in FIG. 9, the traditional organic EL components are operated with a bias voltage applied directly on the two terminals of the organic EL light emitting layer 3. In this invention, on the other hand, with $V_{EL}$ ($<V_{th}$) applied between the ITO anode electrode 2 and the metal back 10, injection of a very small quantity of electrons under vacuum will give rise to light. Such operation reduces power consumption, enhances luminosity, and makes the grey scale of the display adjustable.

The configuration of the organic EL light emitting layer 3 can be changed. For example, FIG. 2 shows a configuration that includes, starting from the ITO anode electrode 2, a hole injection layer 3A, a hole transport layer 3B, and an emission layer 3C.

The main function of the hole injection layer 3A is to effectively inject holes into the hole transport layer 3B. The hole injection layer 3A is made of m-MTDATA ([4,4',4"-tris(3-methyl-phenyl-phenyl-amino)triphenylamine]), with a thickness of around 30 nm. Other materials such as $AlF_3$, CuPc (copper phthalocyanine), $HfO_3$, and $Ta_2O_5$ can also be used. The formula of m-MTDATA is:

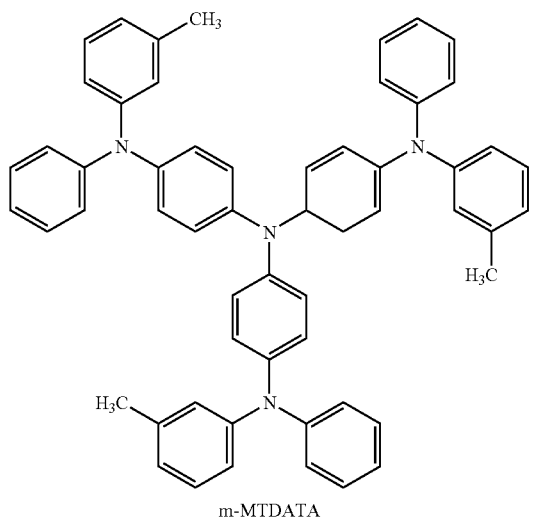

m-MTDATA

The hole transport layer 3B is made of NPB (N,N'-di(naphthalene-1-yl)-N,N'-diphenyl-benzidine) with an approximate thickness of 60 nm. The formula of NPB is:

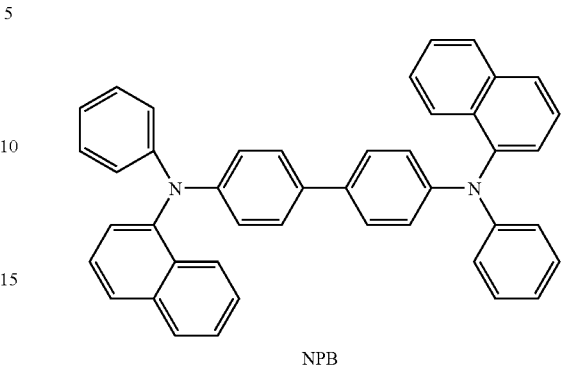

NPB

The emission layer 3C is made of Alq3 (tris-(8-hydroxyquinoline)Aluminum with an approximate thickness of 400 nm. The formula of Alq3 is:

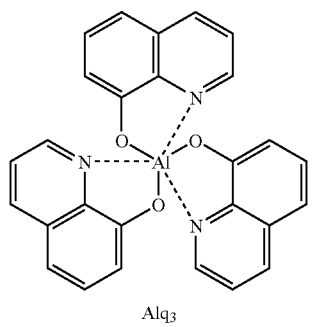

Alq3

The configuration of the organic EL light emitting layer 3 is not limited to the aforementioned examples. The composition of the organic materials and their thickness can be changed to enable the organic EL light emitting layer 3 to generate any light color.

Figure 3:
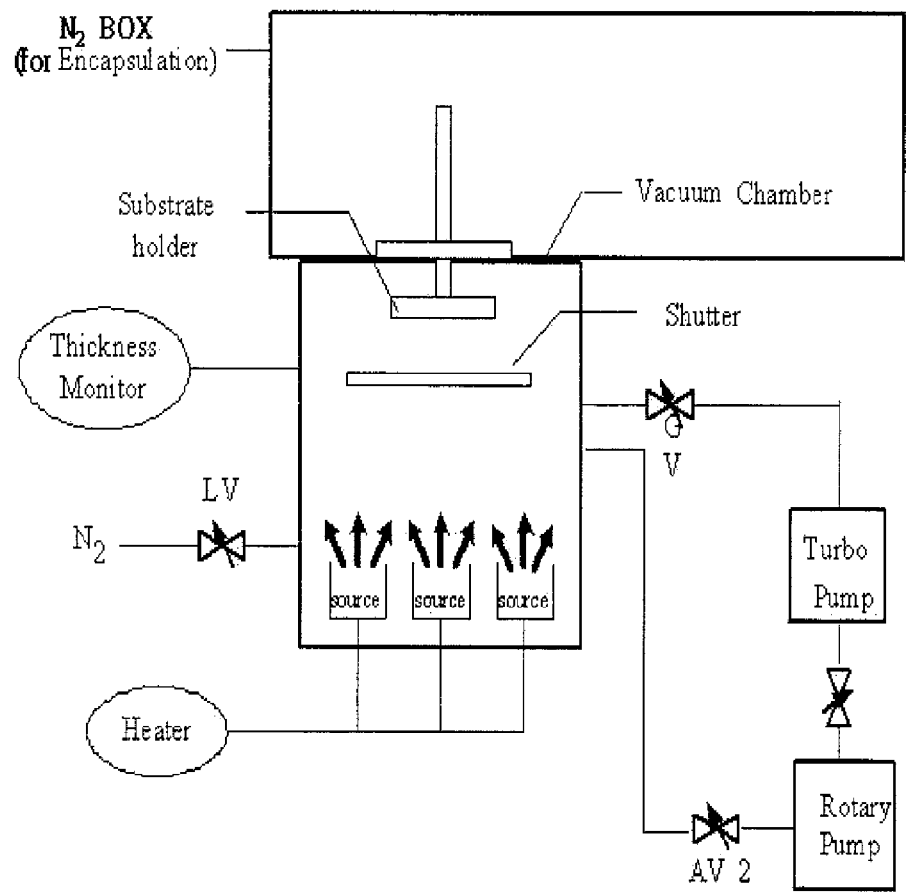
FIG. 3 is a schematic perspective view of a thermal evaporation system for coating the organic EL light emitting layers in the FEOLED device.
Figure 4:
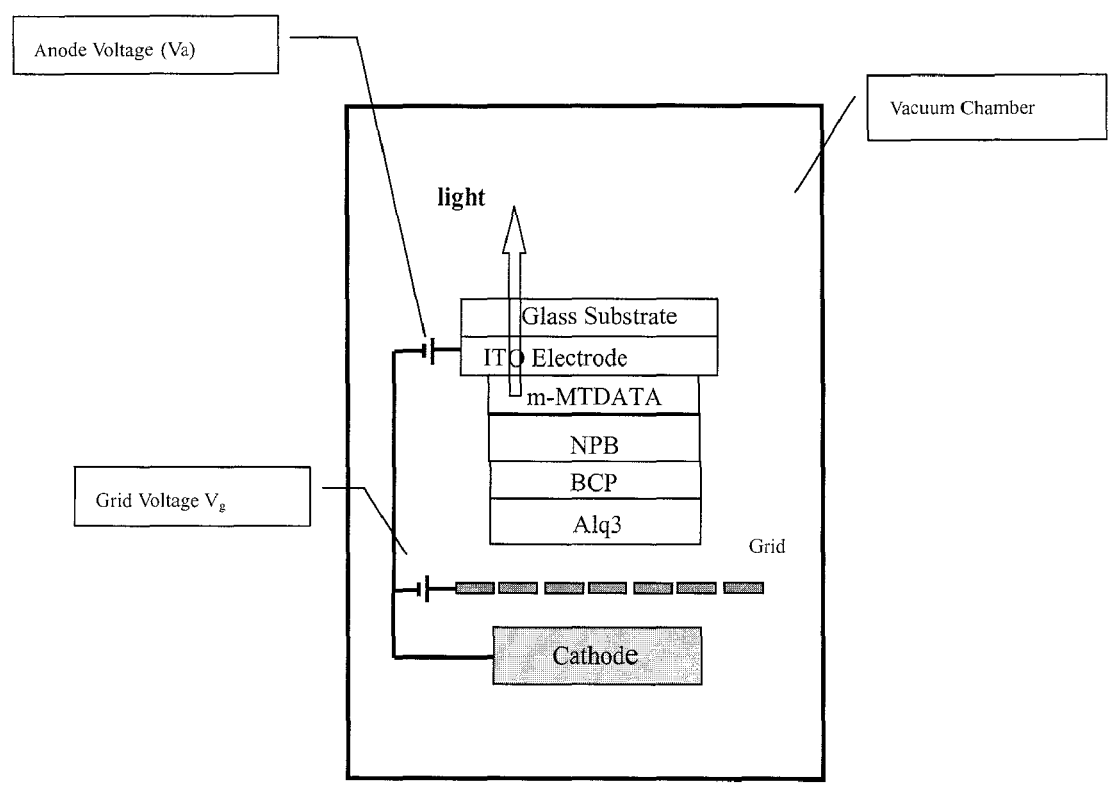
FIG. 4 is a cross-sectional schematic view of an apparatus for measuring the luminescence in the FEOLED device.

The luminescent characteristics and experimental procedures of this invention are described in the following (refer to FIG. 3 through FIG. 5). The ITO coated glass substrate (30× 50 nm) is first washed with acetone, isopropyl alcohol and deionized water. After drying, it is put into a thermal evaporation system to deposit the organic films. As the chamber pressure goes below $2 \times 10^{-6}$ Torr, the following materials will grow sequentially: m-MTDATA (thickness 30 nm), NPB (thickness 60 nm), and Alq3 (thickness 400 nm). The film growth rate is 0.5~2 Å/sec.

After the organic films have been grown on the ITO anode electrode 2, the ITO anode electrode 2 along with the glass substrate is moved into a vacuum measurement chamber. Refer to FIG. 4, the experimental setup includes this ITO anode electrode (with the grown organic films), a Philips 6922 vacuum tube, of which the cathode is used as the electron source, a Keithley 237 high voltage power supply, which applies voltage Va between the ITO anode electrode and the cathode, a Keithley 2400 programmable voltage and current source, which applies grid voltage Vg between the grid and cathode of the Philips 6922 vacuum tube, and a DC power supply which heats up the filament.

As the chamber pressure reaches $6\times10^{-6}$ Torr, the DC power supply starts to apply voltage to the filament. As the voltage increases, the filament temperature rises, which heats up the cathode. When the heated cathode starts to discharge thermionic emission electrons from its surface, the Keithley 2400 is started to apply 20V voltage between the grid and the cathode. The electrons emitting from the cathode will now move toward the grid as they are attracted by the grid's electrical field. The amount of electrons in motion can be measured by the current reading in the Keithley 2400. As the current stabilizes, the Keithley 237 is started to apply voltage between the ITO anode electrode (with grown organic film) and the cathode. The electric field attracts the thermionic emission electrons to bombard the organic film grown on the ITO electrode, giving rise to green light.

Figure 5:
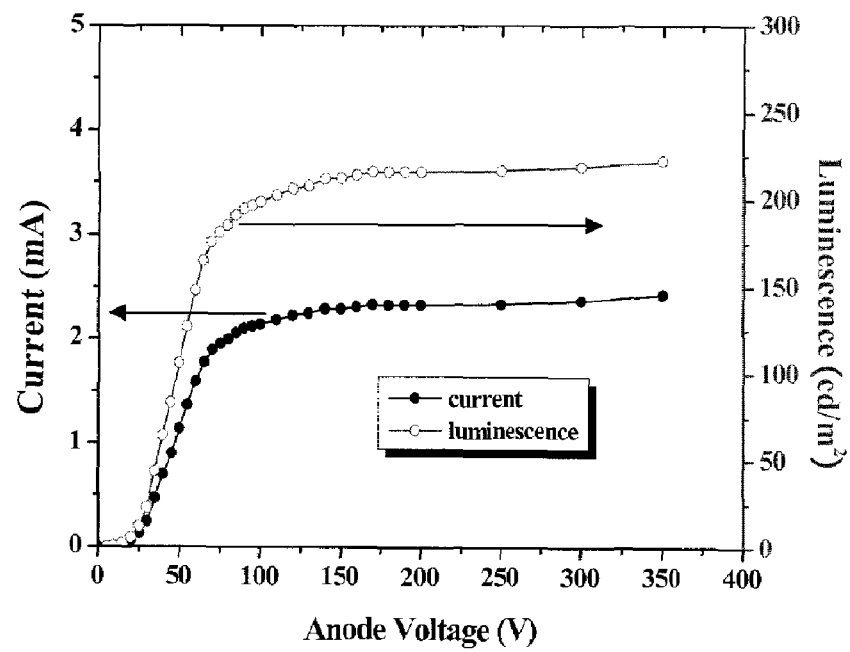
FIG. 5 is a plot of the measured luminescent characteristic in the FEOLED device of the present invention: (a) anode current (mA) and corresponding luminescence ($cd/m^2$) versus anode voltage, (b) anode current density ($mA/cm^2$) and luminescence efficiency (cd/A) versus anode voltage.
Figure 5:
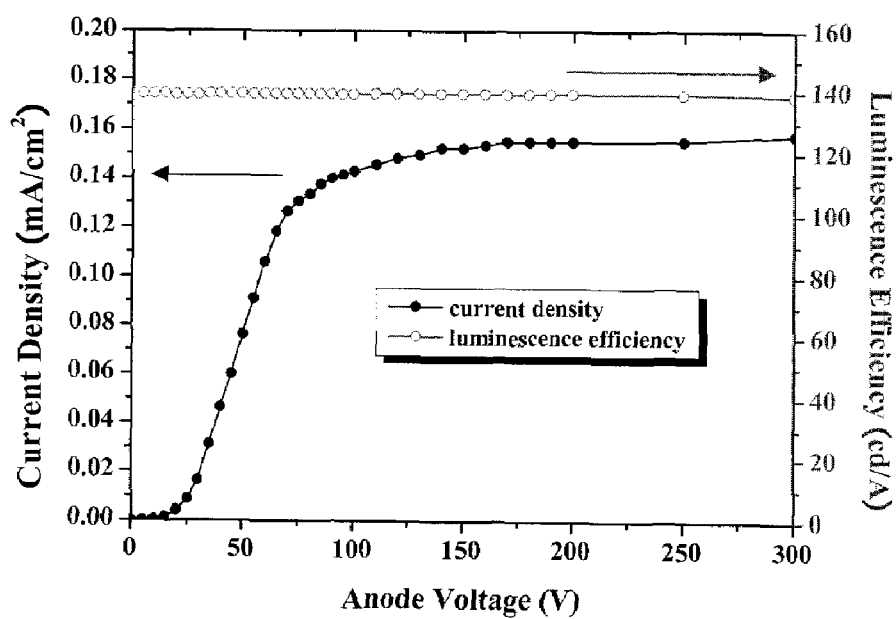

The current-voltage characteristics measured on the ITO anode electrode, as shown in FIG. 5, is similar to that of a diode. In the effective luminescent area (50×30 mm), with 20V grid voltage and 200V anode voltage, the measured anode current is 2,6 mA and the luminance is 210 cd/m². Even under low voltage, thermionic emission electrons start to bombard the organic film, and the luminescent operation on the organic film is observable with bare eyes. When the voltage (Va) is increased to about 100V, however, the current and the luminosity become saturated and stop increasing.

Figure 16:
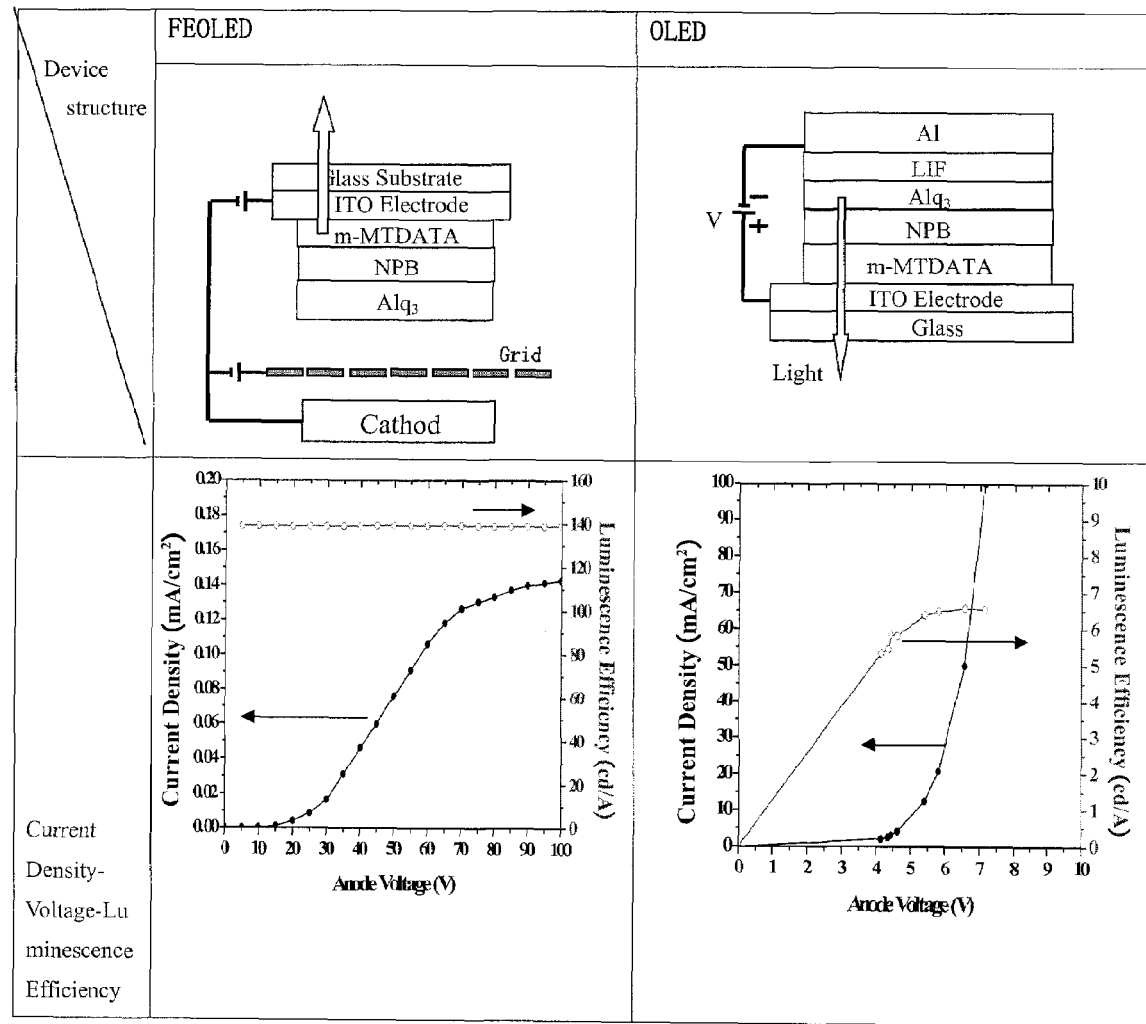
FIG. 16 shows the comparisons of the luminous efficiency (cd/A) and current density (mA/cm$^2$) versus applied anode voltage between the FEOLED device of this invention and the traditional OLED device.

FIG. 16 indicates the luminous efficiency of the FEOLED is about 137 cd/A, much higher than that of the traditional OLED, 7 cd/A.

Figure 7:
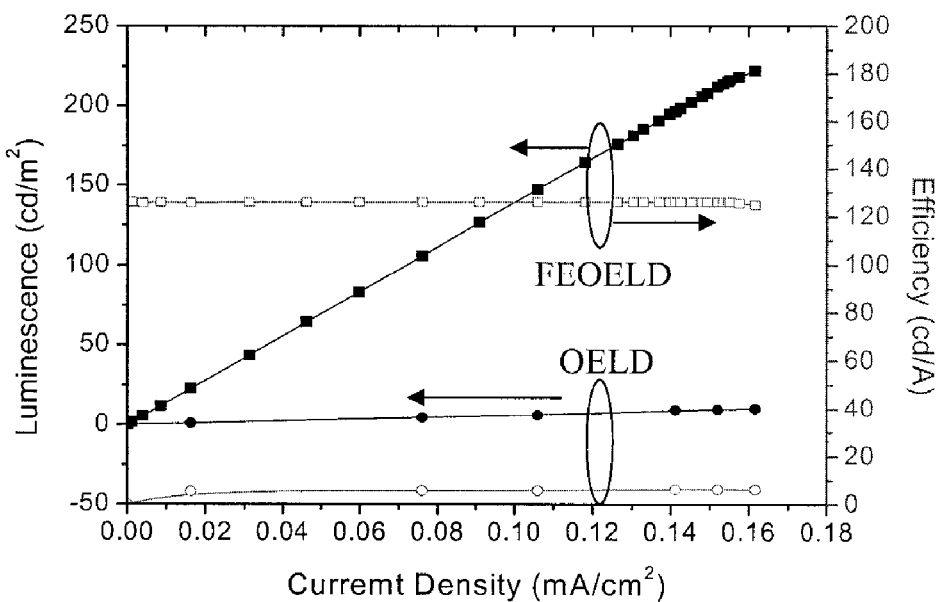
FIG. 7 is a graph showing the comparison in the luminous efficiency (cd/A) and luminescence ($cd/m^2$) versus current density ($mA/cm^2$) for the FEOLED device of the invention and the traditional OLED device.

FIG. 7 compares the luminous efficiency and luminance of FEOLED and OLED in relation to current density. The FEOLED performs far better than the OLED. For example, at 0.14 mA/cm² current density, FEOLED yields luminance 196 cd/m² and luminous efficiency 138 cd/A, while OLED only reaches 9.14 cd/m² and 6.5 cd/A, respectively.

Figure 6:
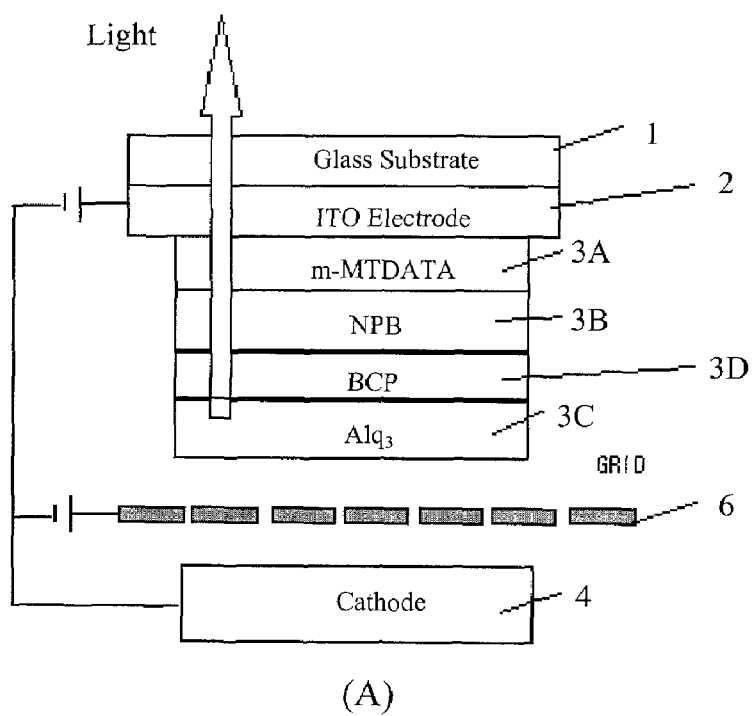
FIG. 6 is an example corresponding to a second embodiment of the present invention for implementing the luminescent mechanism of the FEOLED: (1) schematic view of the FEOLED device, (2) schematic luminescent mechanism diagram of the FEOLED device.
Figure 6:
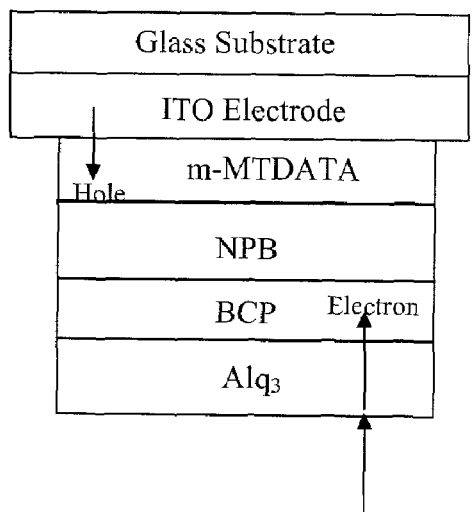
Figure 15:
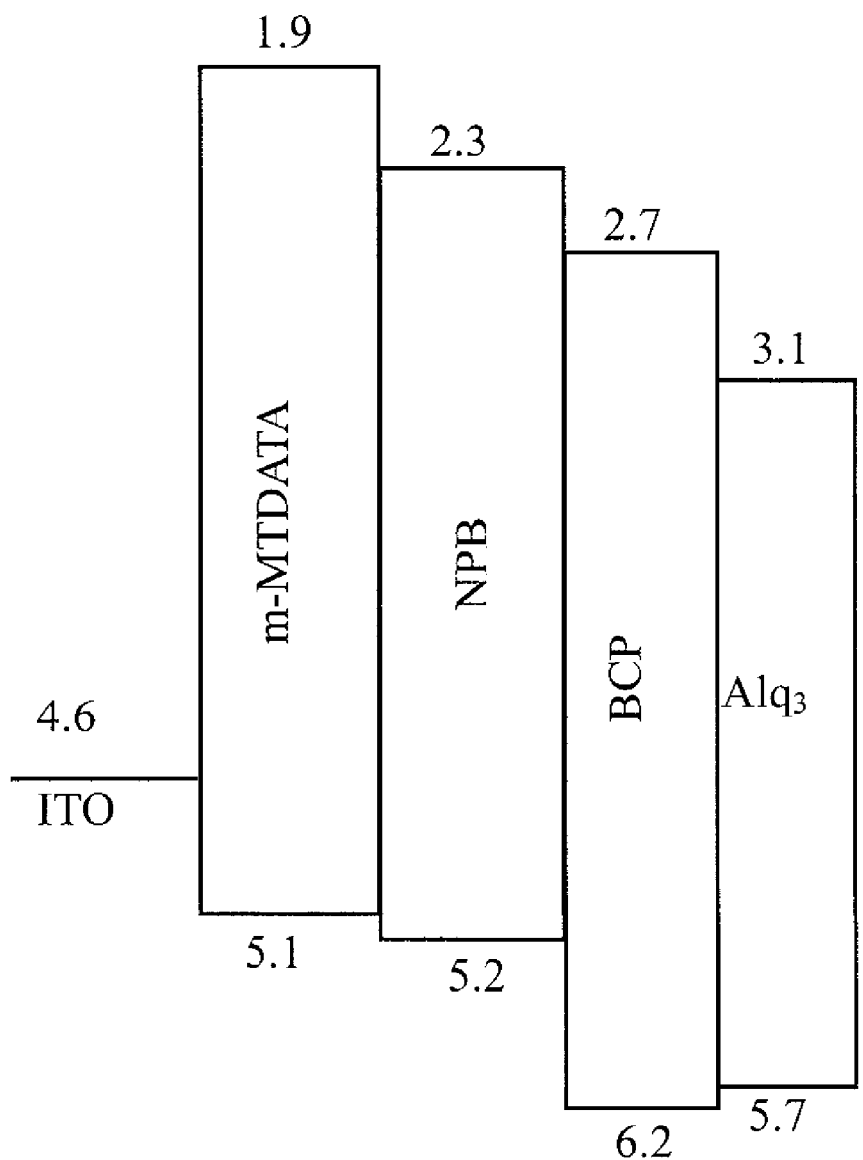
FIG. 15 is an energy band diagram of the organic EL light emitting layers for the second embodiment of the present invention.

To further study the luminescent mechanism of the FEOLED, the following experiment was conducted. A hole blocking layer 3D (BCP) is inserted between the hole transport layer 3B (NPB) and the emission layer 3C (Alq3) of the organic formation, as showed in FIG. 6A. If an OLED is applied a voltage, hole carriers injected from the ITO anode electrode to the hole transport layer (NPB) would be blocked at the interface of the NPB layer and the BCP layer. The electrons (emitted from the cathode and passing through Alq3) would then recombine with the holes accumulated in the NPB layer. This NPB excitation generated by the recombination, according to the energy-level diagram FIG. 15, would give rise to blue light. The Alq3 layer in such case would generate no light. If a cathode luminescence mechanism device is applied with the BCP, on the other hand, electron bombardment on the organic material would generate light in the emission layer Alq3, which, according to FIG. 15, should have green color. As such, when a BCP layer is inserted in an FEOLED device, if blue light is observed, the luminescent mechanism of the FEOLED must be similar to that of the conventional OLED; if green light is observed, the luminescent mechanism must be similar to that of cathode luminescence. The experiment results showed that blue light was observed. Therefore, we concluded that the luminescent mechanism of the FEOLED is similar to that of the OLED device, not cathode luminescence.

This invention is not limited to the description and diagrams presented so far. As long as the essence of the invention is not violated, the structure, formation, and material of the organic EL light emitting layer as well as the dynode can be varied.

What is claimed is:

1. A field emission organic light emitting diode (FEOLED) display, comprising:
    a transparent glass substrate;
    an anode electrode made of indium tin oxides (ITO) coated on the glass substrate;
    an organic electroluminescence (EL) light emitting layer formed on the anode electrode;
    a grid electrode; and
    a cathode electrode, from which electrons are emitted toward the anode electrode,
    wherein the organic EL light emitting layer is disposed between the anode electrode and the grid electrode; the grid electrode is disposed between the organic EL light emitting layer and the cathode electrode; and light emission is caused as electrons emitted from the cathode electrode strike the organic EL light emitting layer.

2. A FEOLED display according to claim 1, wherein the organic EL light emitting layer comprises, starting from the side of the anode electrode, a hole injection layer (HIL), a hole transport layer (HTL) and an emission layer, in such order.

3. A FEOLED display according to claim 1, wherein
    the organic EL light emitting layer comprises, starting from the side of the anode electrode, a hole injection layer (HIL), a hole transport layer (HTL), and an emission layer, in such order;
    a layer of secondary electron material is coated on the emission layer; and
    a metal back is formed on the layer of the secondary electron material.

4. A FEOLED display according to claim 1, wherein the organic EL light emitting layer is coated with a metal back, and the intensity of the light emission can be adjusted by applying a voltage between the anode electrode and the metal back.

5. A FEOLED display according to claim 1, wherein the cathode electrode is a hot electron source cathode, or a cold electron cathode of the CNT type, spindt type, PN type, or surface emission type.

6. A FEOLED display according to claim 1, further comprising:
    a dynode (electron multiplier) disposed between the grid electrode and the organic EL light emitting layer, said dynode having holes in which secondary electron material is coated,
    whereby when the electrons emitted from the cathode electrode pass through the holes of the dynode, the electrons will impact the secondary electron material, thus increasing the number of electrons striking the organic EL light emitting layer.

7. A FEOLED display according to claim 6, wherein the organic EL light emitting layer comprises, starting from the side of the anode electrode, a hole injection layer (HIL), a hole transport layer (HTL) and an emission layer, in such order.

8. A FEOLED display according to claim 6, wherein
    the organic EL light emitting layer comprises, starting from the side of the anode electrode, a hole injection layer (HIL), a hole transport layer (HTL), and an emission layer, in such order;
    a layer of secondary electron material is coated on the emission layer; and a metal back is formed on the layer of the secondary electron material.

9. A FEOLED display according to claim 6, wherein the organic EL light emitting layer is coated with a metal back, and the intensity of the light emission can be adjusted by applying a voltage between the anode electrode and the metal back.

10. A FEOLED display according to claim 6, wherein the cathode electrode is a hot electron source cathode, or a cold electron cathode of the CNT type, spindt type, PN type, or surface emission type.

11. A FEOLED display according to claim 6, wherein the dynode is of a metal channel type, box type, line focus type, mesh type, or MPC type.

12. A FEOLED display according to claim 6, wherein the secondary electron material is Cu—Be alloy or Ag—Mg alloy.

13. A field emission organic light emitting diode display according to claim 1, wherein the organic EL light emitting layer is coated with secondary electron material.

14. A FEOLED display according to claim 13, wherein the organic EL light emitting layer comprises, starting from the side of the anode electrode, a hole injection layer (HIL), a hole transport layer (HTL) and an emission layer, in such order.

15. A FEOLED display according to claim 13, wherein the organic EL light emitting layer is coated with a metal back, and the intensity of the light emission can be adjusted by applying a voltage between the anode electrode and the metal back.

16. A FEOLED display according to claim 13, wherein the cathode electrode is a hot electron source cathode, or a cold electron cathode of the CNT type, spindt type, PN type, or surface emission type.

17. A FEOLED display according to claim 13, wherein the secondary electron material is an oxide of Be, Mg or Ca.

18. A FEOLED display according to claim 1, wherein the organic EL light emitting layer is coated with secondary electron material or a metal back so that a separate voltage can be applied.

* * * * *